(12) United States Patent
Johnson

(10) Patent No.: US 6,314,000 B1
(45) Date of Patent: Nov. 6, 2001

(54) ENCLOSURE FOR AN RF ASSEMBLY

(75) Inventor: Michael Gunnar Johnson, Sparta, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/141,182

(22) Filed: Aug. 27, 1998

(51) Int. Cl.[7] .................................................. H05K 9/00
(52) U.S. Cl. ........................ 361/816; 361/800; 361/818; 361/814; 361/753; 174/35 R; 174/35 GC; 206/706; 206/719
(58) Field of Search .................................. 361/752, 753, 361/736, 760, 796, 807, 800, 814, 816, 818; 206/719, 706; 334/85; 455/90; 174/17 R, 35 R, 35 GC

(56) References Cited

U.S. PATENT DOCUMENTS

| | | | |
|---|---|---|---|
| 3,816,911 | * 6/1974 | Knappenberger | 29/626 |
| 4,705,916 | * 11/1987 | Wadhera et al. | 174/35 GC |
| 4,868,716 | * 9/1989 | Taylor et al. | 361/424 |
| 5,252,782 | * 10/1993 | Cantrell et al. | 174/35 R |
| 5,566,055 | * 10/1996 | Salvi, Jr. | 361/816 |
| 5,847,317 | * 12/1998 | Phelps | 174/35 R |
| 6,037,541 | 3/2000 | Bartley et al. | 174/66 |

OTHER PUBLICATIONS

Tool and Manufacturing Engineers Handbook, Fourth Edition, vol. IV, Charles Wick, Editor–in–Chief, 1987, Chapter 8, p. 8–54.

* cited by examiner

Primary Examiner—Jeffrey Gaffin
Assistant Examiner—Tuan Dinh
(74) Attorney, Agent, or Firm—Irena Lager

(57) ABSTRACT

An enclosure having two walls an attenuation distance apart from each other perpendicular to the plate of the enclosure. At least one of the walls is orbitally riveted or soldered to the plate of the enclosure. Having two walls an attenuation distance from each other is particularly advantageous for RF components. The two walls can be placed to surround the RF component to reduce the RF energy generated by the component that escapes in to the atmosphere, or the two walls can be placed to separate the RF component from other component in the same enclosure to reduce the interference of the RF component with the other components. Alternatively, the enclosure can have a single wall orbitally riveted to the plate of the enclosure with an RF gasket attached to the entire length of the wall to reduce the amount of RF energy that is able to pass around the wall.

26 Claims, 7 Drawing Sheets

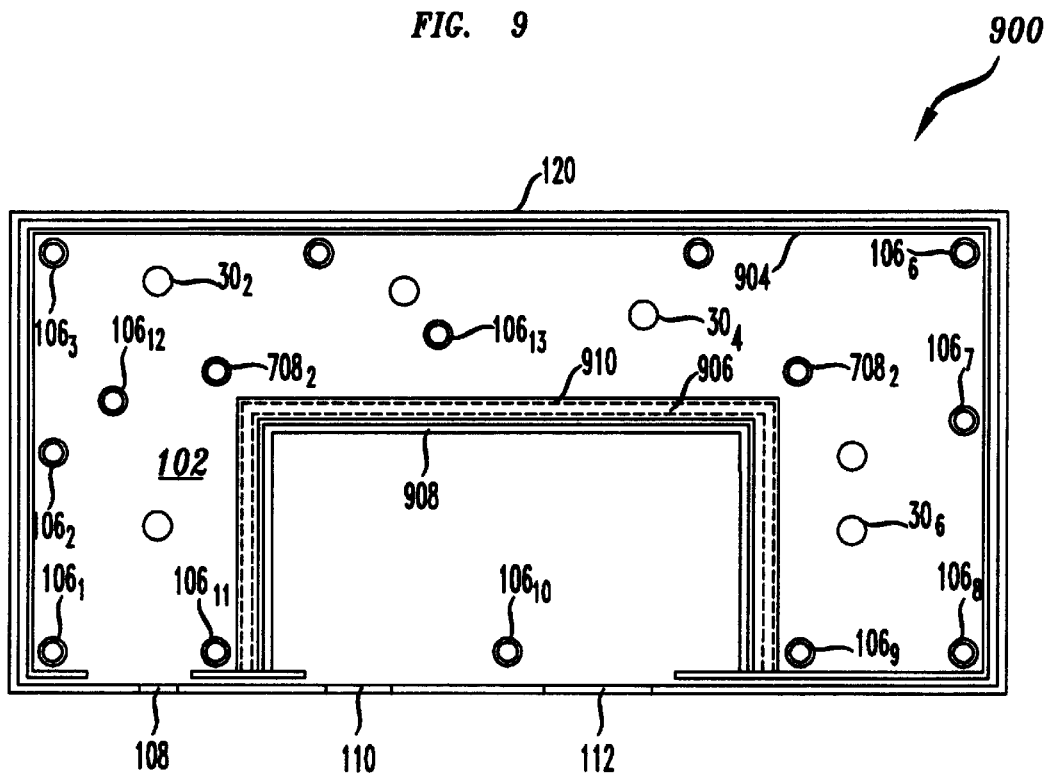
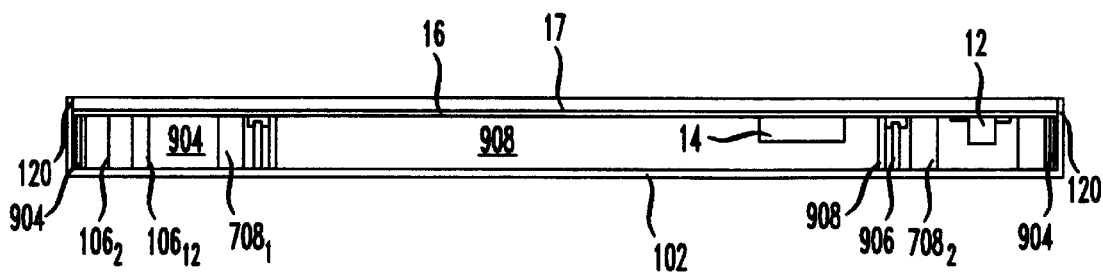

ENCLOSURE FOR AN RF ASSEMBLY

FIELD OF THE INVENTION

This invention is related to enclosures, and more particularly to enclosures for RF assemblies.

BACKGROUND OF THE INVENTION

The performance of an electronic device can be affected by the environment of the device. RF components and circuit boards for RF components face a particular problem. The enclosure for an RF circuit needs to prevent any RF energy radiated by the circuit from escaping out of the enclosure and interfering with other circuitry of the device or with other nearby devices. Additionally, in most areas the FCC has specific limitations on how much RF energy the electronic device can release into the atmosphere. These limitations are meant to prevent an RF device from interfering with other devices.

The problem of preventing interference is even more significant for circuit boards that contain both RF and digital components. The RF energy radiated from the RF component is at a much higher frequency than the frequency used by the digital component. If this high frequency reaches the digital component it interferes with the much lower frequency of the clocks of the digital component, thereby disrupting the operation of the digital component. One problem caused by RF leakage is that the RF signals create false clock signals or edges for the digital component.

In an effort to minimize the interference, the enclosures for RF components are designed to shield and to attenuate as much of the RF energy as possible. The enclosures are fabricated from a material such as aluminum that balances the desire to keep the enclosure as inexpensive and lightweight as possible and the requirement to attenuate RF radiation. The enclosures are typically cast out of the aluminum into the desired shape.

FIG. 1 shows an assembly that has both RF component 12 and digital component 14 on circuit board 16 attached to a conventional enclosure and to back plate 17. FIG. 2 shows a top view of enclosure 20 of FIG. 1. Referring to FIGS. 1 and 2 concurrently, enclosure 20 has plate 22, wall 24 that surrounds all of the components, and wall 26 that separates RF component 12 and digital component 14. Wall 24 has openings $15_1$, $15_2$, $15_3$ through which power, ground, and any other connections are supplied to components 12, 14 and circuit board 16. Wall 24 has lower portion 34 and upper portion 27. Circuit board 16 fits against lower portion 34. Enclosure 20 has standoffs $28_1$ . . . $28_{15}$, for fasteners, typically screws, that attach enclosure 20 to circuit board 16. The tops of standoffs $28_1$ . . . $28_{15}$ fit through openings in circuit board 16. Optionally, enclosure 20 also includes tuning openings $30_1$ . . . $30_6$ for inserting testing and tuning instruments to test and tune the components after the assembly is encased in enclosure 20. Once the testing and tuning is complete the tuning openings $30_1$ . . . $30_6$ are covered with electromagnetic interference (EMI) tape, which is a thin aluminum tape used to prevent any RF energy from escaping through the tuning openings $30_1$ . . . $30_6$.

Enclosure 20 should avoid any gaps between walls 24, 26 and circuit board 16 because RF energy escapes through these gaps. To prevent gaps there is a large amount of torque on the screws that hold circuit board 16 and enclosure 20 together. Additionally, the screws are placed close to walls 24, 26 to tightly fasten circuit board 16 to enclosure 20. The torque on the screws is typically large enough that if the screws were not placed in standoff $28_1$ . . . $28_{15}$ that absorb some of the force of the screws, the screws could bend plate 22 of enclosure 20.

A problem with conventional enclosures is that even if circuit board 16 is tightly pressed against enclosure 20 too much RF energy passes around each of walls 24 and 26.

Additionally, the tolerance of the metal may still allow for gaps between walls 24, 26 and circuit board 16. As shown in FIG. 3, in an effort to eliminate these gaps, RF gasket 32 can be placed on wall 26. RF gasket 32 is a silver filled silicone rubber gasket. Referring to FIGS. 1 and 4, RF gasket 32 has groove 36. Groove 36 allows two sides 37, 38 of RF gasket 32 to fit around, a wall or around a notch in the wall, so that RF gasket 32 surrounds an end of the wall. This prevents RF energy from escaping around any gaps between the end of the wall and circuit board 16. Unfortunately, since lower portion 34 of wall 24 is attached to upper portion 27 and there are no notches in lower portion 34, RF gasket 32 cannot be easily placed against lower portion 34 to assist in eliminating any gaps between wall 24 and circuit board 16.

Referring to FIGS. 3 and 4, another problem with conventional enclosure 20 is that with conventional casting equipment if two shapes are not located far enough apart the area between them is filled solid. Standoffs $28_1$ . . . $28_{13}$ should be in locations where the screws through standoffs $28_{28}$ . . . $28_{13}$, fasten enclosure 20 tightly enough to circuit board 16 to try to prevent gaps. This typically locates standoffs $28_1$ . . . $28_{13}$ close enough to walls 24, 26 that the areas between standoffs $28_1$ . . . $28_{13}$ and walls 24, 26 are filled with metal connections $36_1$ . . . $36_{13}$. The metal connections $36_1$ . . . $36_{13}$ do not allow RF gasket 32 to be placed on the portion of wall 26 attached to the metal connections.

SUMMARY OF THE INVENTION

The invention solves the above problems by providing an enclosure with two walls perpendicular to the plate that are close to each other to increase the attenuation of energy generated by a component. In the preferred embodiment, at least one of the walls is orbitally riveted to the plate of the enclosure. Both wall can be orbitally riveted to the plate, or one of the walls can be formed by bending the outer portions of the plate to form a wall, or by casting the wall in the same cast used to form the plate, or by soldering the wall in place. Having two walls close to each other is particularly advantageous for RF components. When the two walls are placed to surround the RF component they reduce the amount of RF energy that escapes into the atmosphere. When the two walls separate the RF component from other component in the same enclosure the wall reduce the interference of the RF component with the other components.

In an alternative embodiment of the invention, a single wall orbitally riveted to plate of an enclosure can be used. Because the orbitally riveted wall can be fully stand alone and is not connected to the standoffs, an RF gasket can be attached to entire length of the wall without gaps in the length of the RF gasket, thereby reducing the amount of RF energy that is able to pass around the wall.

BRIEF DESCRIPTION OF THE DRAWINGS

It should be noted that the Figures are drawn to best illustrate preferred embodiments of the invention and are not drawn to scale.

FIG. 5b is a cross-section of the enclosure of FIG. 5a;

FIG. 9 is a top view of an enclosure having an outer and inner wall an attenuation distance from each other, and two dividing wall an attenuation distance from each other; and FIG. 10 is a side view of an enclosure of FIG. 9.

DETAILED DESCRIPTION

Figure 1:
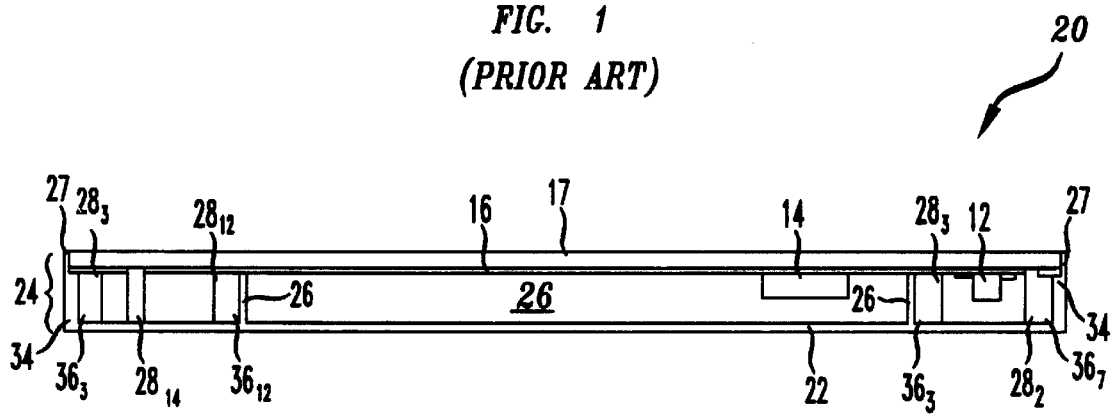
FIG. 1 is a cross-section of a conventional enclosure attached to an assembly.
Figure 2:
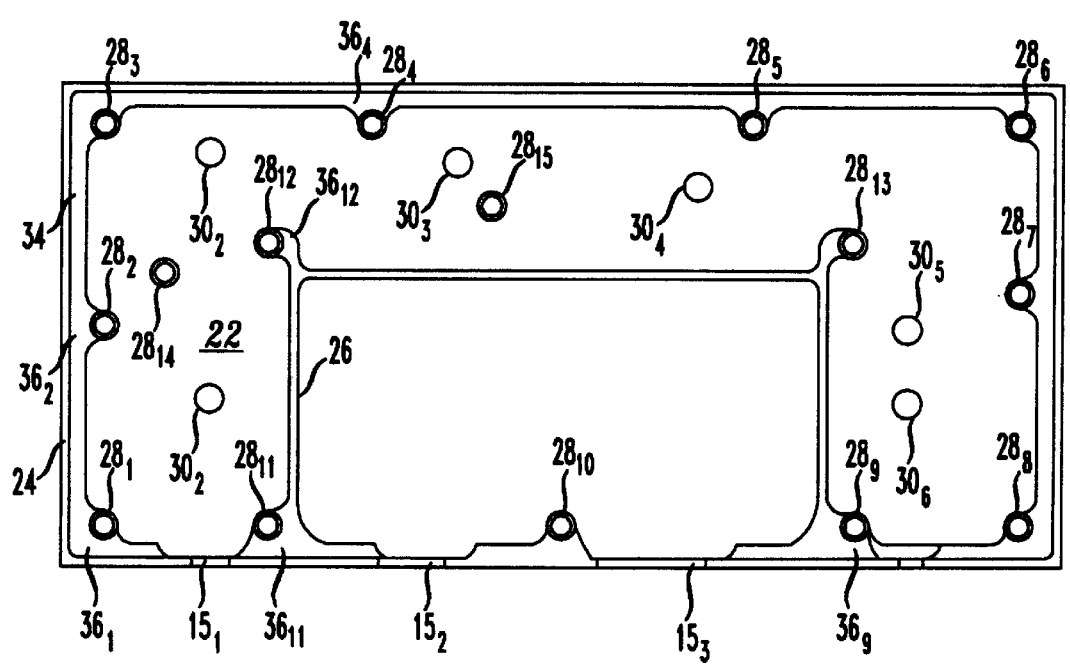
FIG. 2 is a top view of a conventional enclosure.
Figure 3:
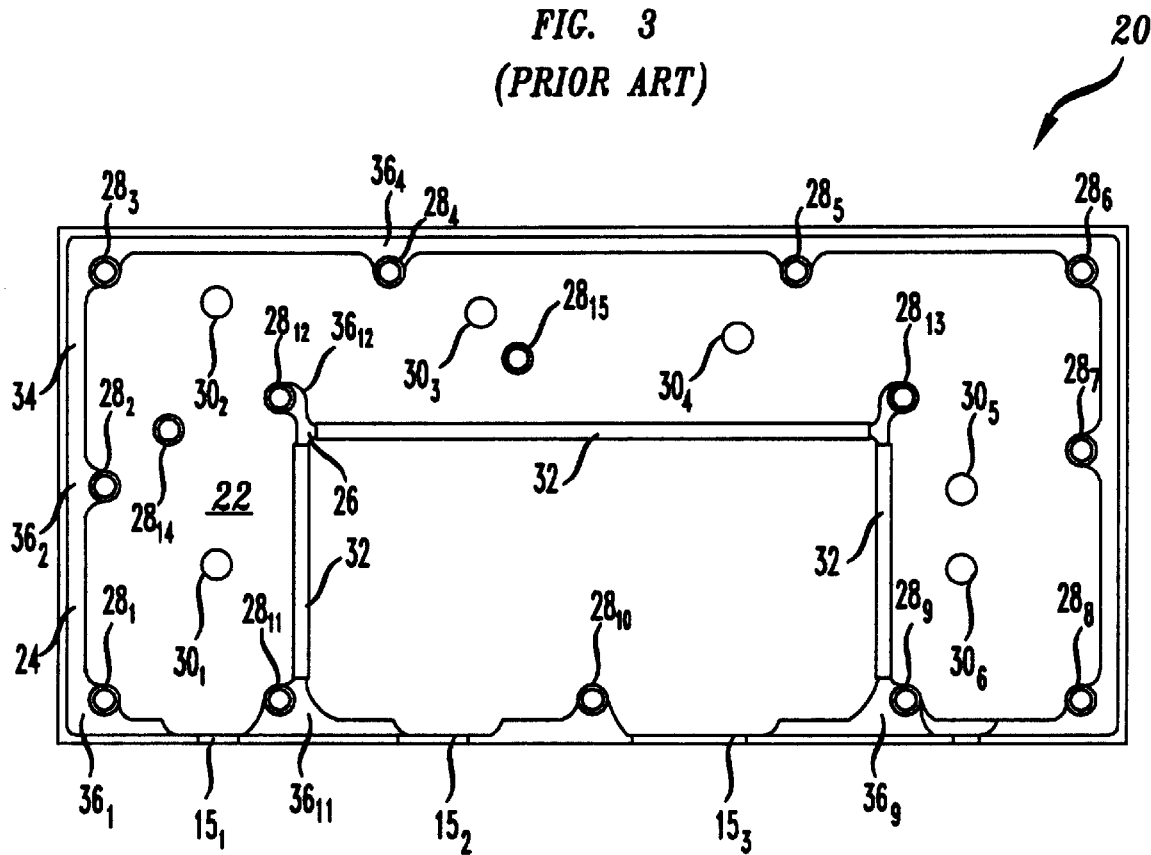
FIG. 3 is a top view of a conventional enclosure with an RF gasket.
Figure 4:
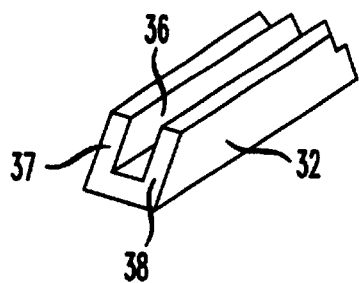
FIG. 4 is a perspective view of an RF gasket.
Figure 5A:
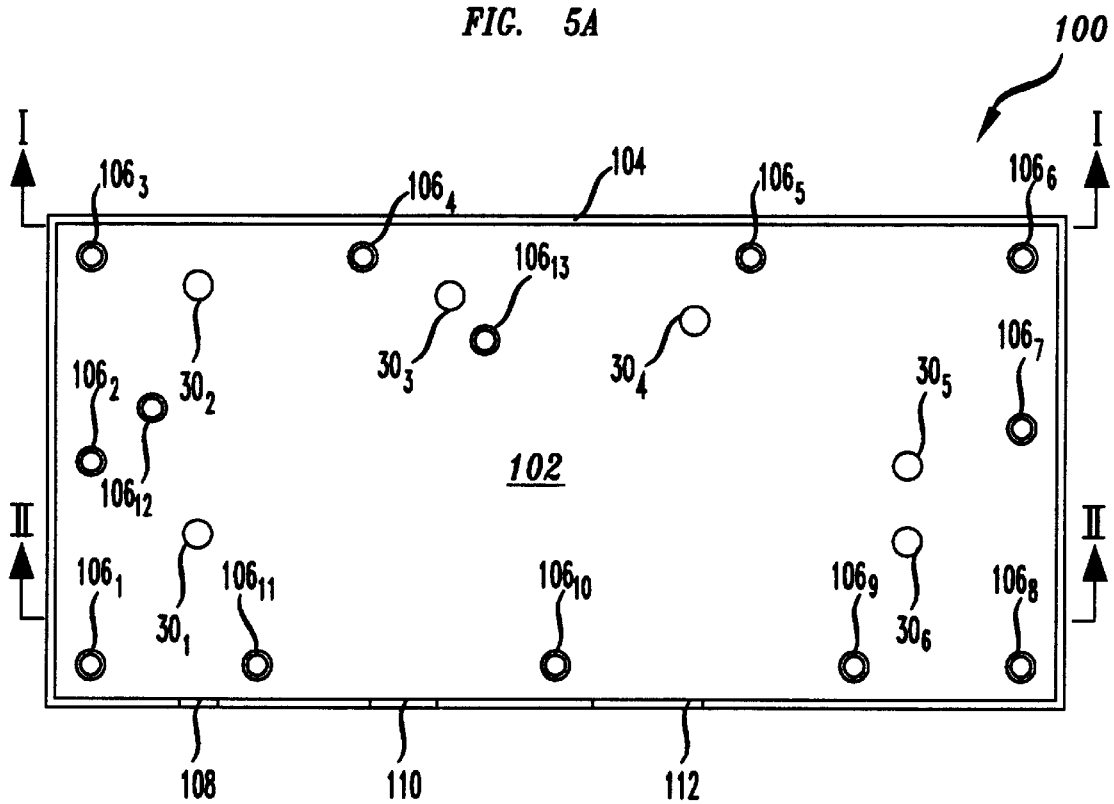
FIG. 5a is a top view of an enclosure having a wall orbitally riveted to a plate of the enclosure.
Figure 5B:
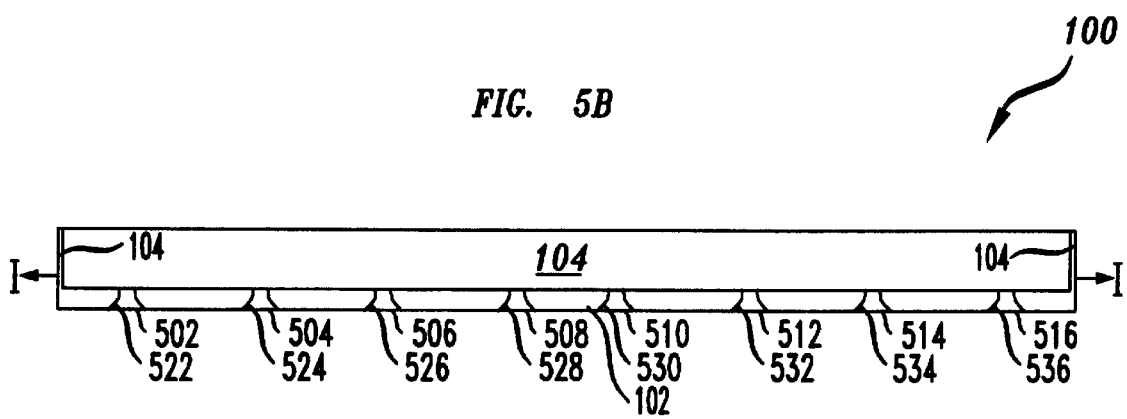

Referring to FIG. 5a, an enclosure according to an embodiment of the present invention is generally designated by reference numeral 100. Referring to FIG. 5b, enclosure 100 has plate 102, and wall 104 orbitally riveted to plate 102. As shown in FIG. 5b, protuberances 502, 504, 506, 508, 510, 512, 514, and 516 in wall 104 fit into recesses 522, 524, 526, 528, 530, 532, 534, and 536 in plate 102. Enclosure 100 is made out of sheet metal of aluminum or any other material that balances the desire to keep enclosure 100 light and inexpensive, yet attenuates RF energy.

Figure 5C:
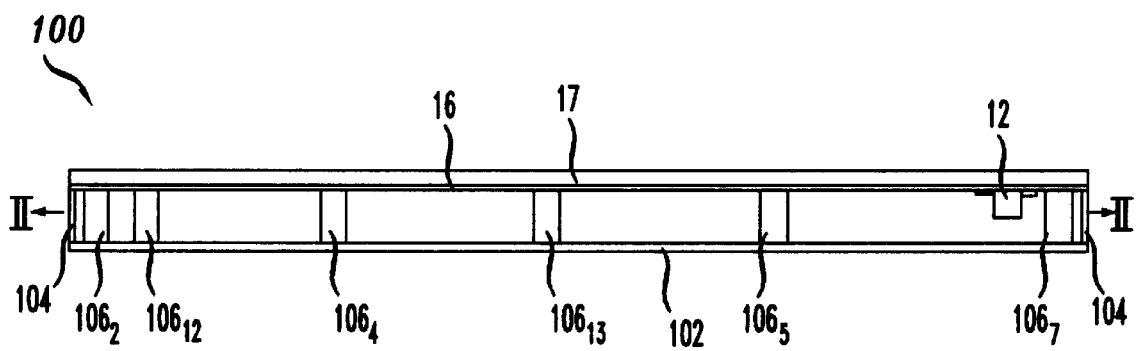
FIG. 5c is a cross-section of the enclosure of FIG. 5a attached to an assembly.

Referring to FIG. 5c, enclosure 100 fits over an assembly, having RF component 12 attached to circuit board 16, such that wall 104 surrounds component 12 to prevent any RF energy generated by RF component 12 from escaping out of enclosure 100. Referring to FIG. 5a, enclosure 100 includes standoffs $106_1 \ldots 106_{13}$ that are used to fasten enclosure 100 to circuit board 16. Standoffs $106_1 \ldots 106_{13}$ are fabricated separately from plate 102 and press fit to plate 102. Standoffs $106_1 \ldots 106_{11}$ should placed such that manufacturing the openings for standoff $106_1 \ldots 106_{11}$ leaves a wide enough portion of plate 102 so that plate 102 is not damaged. Preferably standoffs $106_1 \ldots 106_{11}$ are at least 0.1 in from wall 104. Enclosure 100 also includes openings 108, 110, 112 through which power, ground, and any other connections are supplied to component 12 and circuit board 16. Openings 108, 110, 112 should be approximately the size of the connector that will be placed in them to ensure that there are no gaps in openings 108, 110, 112. Optionally, enclosure 100 includes tuning openings $30_1 \ldots 30_6$ for inserting testing and tuning instruments to test and tune the components after the components are encased in enclosure 100. Once the testing and tuning is complete the tuning openings $30_1 \ldots 30_6$ are covered with EMI tape to prevent any RF energy from escaping through the tuning openings $30_1 \ldots 30_6$. An RF gasket can be attached to wall 104 to eliminate any gaps that may form between wall 104 and circuit board 16 due to the tolerances of wall 104.

Figure 6:
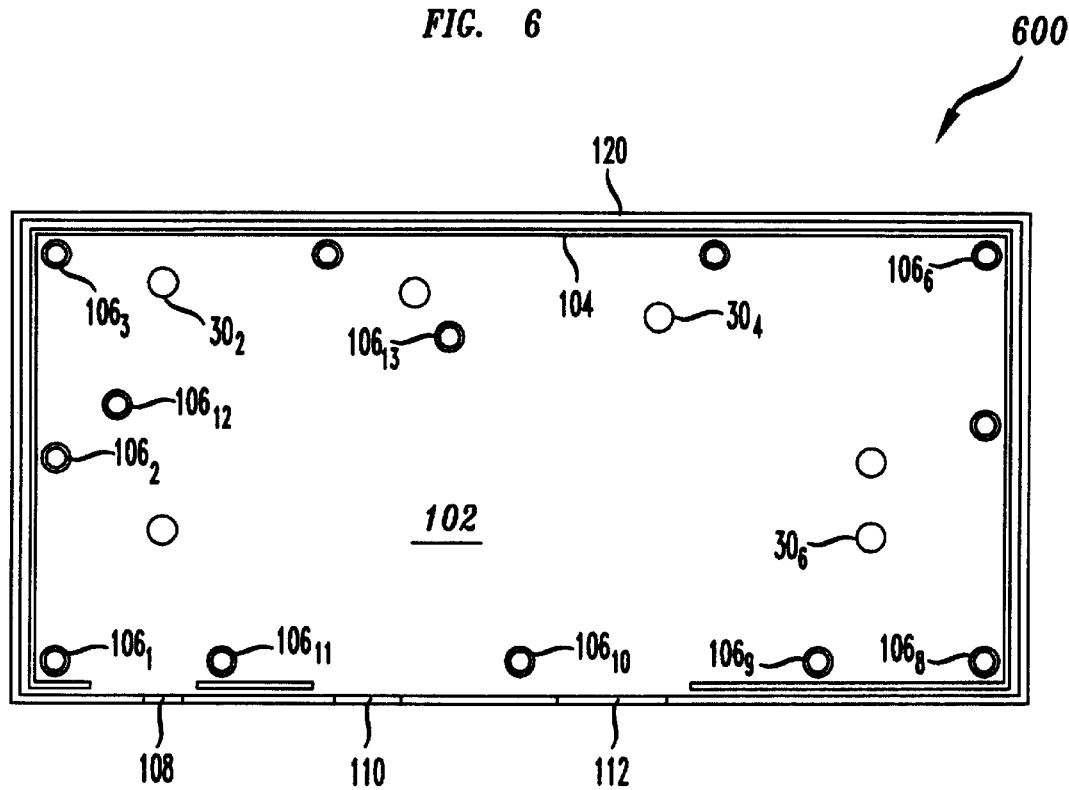
FIG. 6 is a top view of an enclosure having a first wall orbitally riveted to a plate of the enclosure and a second wall an attenuation distance from the first wall.

As shown in FIG. 6, preferably the enclosure also includes outer wall 120 located an attenuation distance from wall 104. The distance between walls 104, 120, i.e. the attenuation distance, should be small enough such that any RF energy that passes around wall 104 will further attenuate significantly when it has to make right turns in such a small distance to pass around outer wall 120. Preferably, the attenuation distance is as small as it is possible to place to walls near each other using conventional manufacturing techniques. For example, for when inner wall 104 is orbitally riveted, and component is an RF amplifier, the attenuation distance can be about 0.06 in to 0.12 in. An attenuation distance smaller than one eighth of the wavelength of the frequency of the RF component should further significantly attenuate RF energy when it has to make right turns in such a small distance to pass around outer wall 120.

Wall 120 is located at the edge of plate 102 and is higher than wall 104. Wall 120 can be manufactured by bending the outer edges of plate 102 and welding the corners, or by separately manufacturing it and either orbitally riveting or soldering it to plate 102, or by casting wall 120 as part of the mold in which plate 102 is manufactured.

Plate 102 is long and wide enough such that circuit board 16 fits completely within wall 120 and still presses against wall 104. This allows for easier handling of enclosure 100 and the assembly once they are connected. Although, plate 102 does not have to be longer and wider that circuit board 16. In this case walls 104 and 120 should be about the same height such that both walls press against circuit board 16.

Figure 7A:
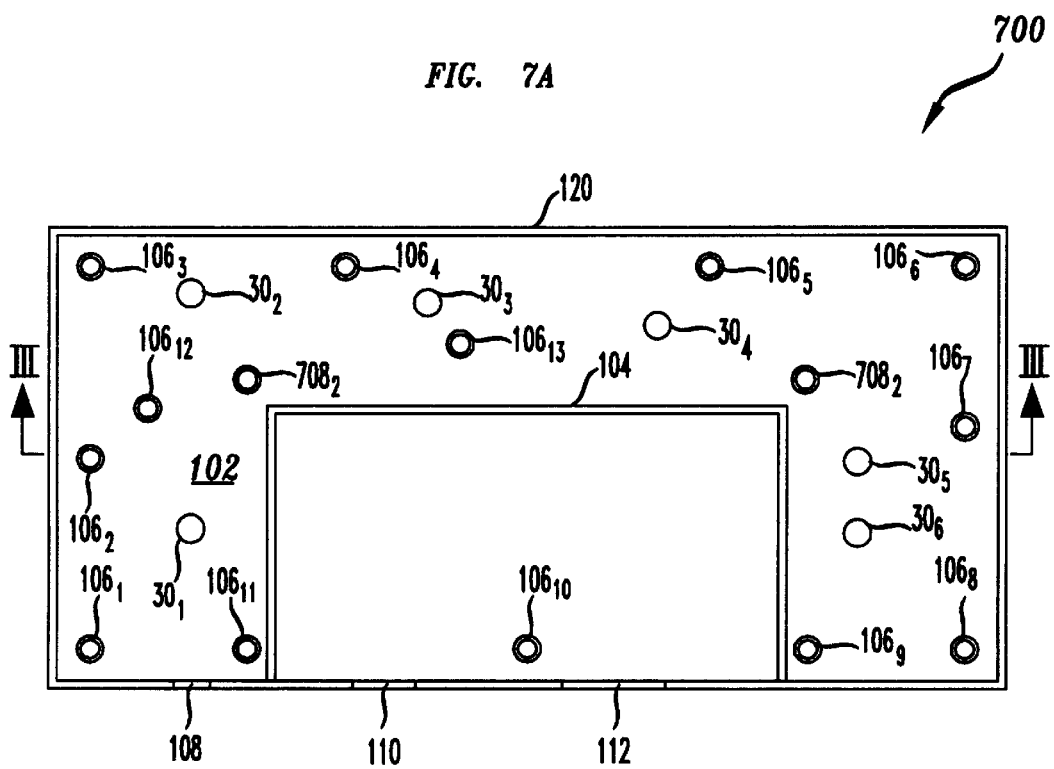
FIG. 7a is a top view of an enclosure having a wall orbitally riveted to a plate of the enclosure.
Figure 7B:
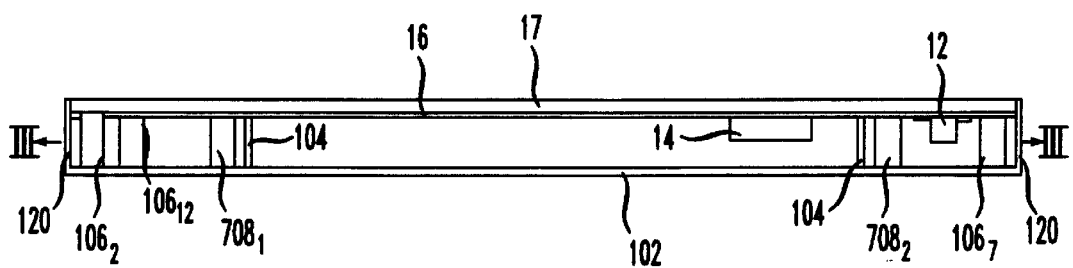
FIG. 7b is a cross-section of the enclosure of FIG. 7a attached to an assembly.

Referring to FIGS. 7a and 7b concurrently, in an alternative embodiment of the invention, enclosure 700 fits over an assembly, having RF component 12 and digital component 14 attached to circuit board 16, such that wall 104 separates components 12 and 14. Like the enclosure described above, enclosure 700 includes standoffs $106_1 \ldots 106_{13}$, openings 108, 110, 112 and optionally, enclosure 100 includes tuning openings $30_1 \ldots 30_6$. Enclosure 700 also includes outer wall 120 for preventing RF energy from escaping out of the enclosure, and standoffs $708_1, 708_2$ for tightening wall 104 to circuit board 16. An RF gasket can be attached to the top edge of wall 104 to eliminate any gaps that may form between wall 104 and circuit board 16 due to the tolerances of wall 104. Digital component 14 can be placed in a can. The can is a metal sheath that completely encloses and seals a device. When digital component 14 is placed in a can, wall 104 is an attenuation distance from the can.

Figure 8:
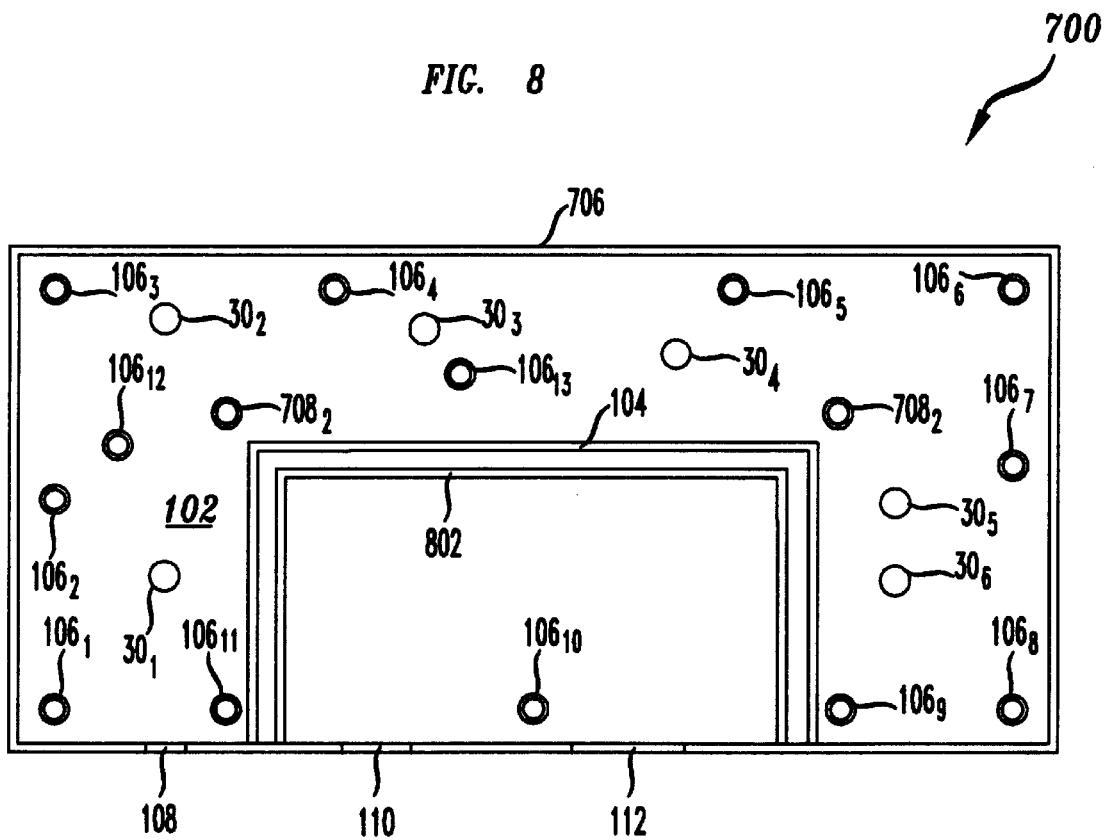
FIG. 8 is a top view of an enclosure having first and second walls an attenuation distance apart orbitally riveted to a plate of the enclosure.

As shown in FIG. 8, preferably the enclosure also includes a second dividing wall 802 located an attenuation distance from wall 104. Wall 802 can be separately manufactured and either orbitally riveting or soldering it to plate 102 as shown in FIG. 8, or by casting wall 802 as part of the mold in which plate 102 is manufactured.

In another alternative embodiment of the invention, shown in FIGS. 9 and 10, the enclosure includes two wall located an attenuation distance from each other. The walls are both perpendicular to the plate of the enclosure. The wall can be manufactured as described above, or in any known manner that allows the wall to be an attenuation distance from each other. When the walls are walls 120 and 904 that surround components 12, 14 to prevent RF energy from escaping out of the enclosure, inner wall 904 is attached to the plate by soldering or orbital riveting and outer wall 120 is manufactured like wall 120 of FIG. 6. Typically, it is more expensive to solder the wall to the plate of the enclosure, and therefore it is preferable to orbitally rivet the wall to the plate of the enclosure. When the walls are used to separate the RF component 12 and digital component 14 such as walls 906 and 908 both walls are either soldered or orbitally riveted to the plate of the enclosure.

Although the invention has been described with the wall or walls either surrounding the entire assembly or separating the components of the assembly, one skilled in the art will understand that the wall described above can be combined in any combinations of the above embodiments. For example, the enclosure can include an outer wall manufactured by bending the outer edges of the plate and welding the corners, an inner wall orbitally riveted to the plate of the enclosure an attenuation distance from the outer wall, and a dividing wall orbitally riveted to the plate of the enclosure. In another example, as shown in FIGS. 9 and 10, the enclosure includes outer wall 120 manufactured by bending the outer edges of plate 102 and welding the corners, inner wall 904 soldered to the plate of the enclosure an attenuation distance from the outer wall, first dividing wall 906 orbitally riveted to the plate of the enclosure, and second dividing wall 908 orbitally riveted to the plate of the enclosure. Optionally, gasket 910 can be added to the top edge of first dividing wall 906, as shown, and/or to inner wall 904 (not shown), and/or to second dividing wall 908 (not shown) to reduce RF energy from escaping around any gaps between the walls and the circuit board. Furthermore, additional walls can be added either to the wall 120, 904 or to dividing walls 906, 908. Each of the additional walls is positioned an attenuation distance from one of the walls of the enclosure. In deciding on whether to include the additional walls, the benefit of the amount of RF energy attenuated by the additional wall should be balanced with the cost of each additional wall.

While the invention has been described with reference to a preferred embodiment, it will be understood by those skilled in the art having reference to the specification and drawings that various modifications may be made and various alternatives are possible therein without departing from the spirit and scope of the invention.

I claim:

1. An electronic device comprising:
    an assembly having:
        a board; and
        an electronic component coupled to the board, the electronic component operates at a frequency and generates electromagnetic energy at least at the frequency; and
    an enclosure including:
        a plate coupled to the assembly such that the electronic component is located between the plate and the board; and
        a wall orbitally riveted to the plate such that the wall is located between the plate and the board, where the wall being orbitally riveted to the plate by at least one protuberance in the wall fitting into at least one recess in the plate;
        an outer wall perpendicular to the plate, the outer wall positioned and attenuation distance from the wall.

2. The enclosure of claim 1, further comprising an RF gasket attached to the wall, at least a portion of the RF gasket located between the wall and board.

3. The enclosure of claim 1, wherein the attenuation distance comprises a distance at which the electromagnetic energy at the frequency attenuates significantly.

4. The enclosure of claim 1, wherein the outer wall is orbitally riveted to the plate.

5. The electronic device of claim 1, wherein the electronic component is an RF component and the assembly further includes a digital component operating at a digital frequency, the enclosure further comprising a first dividing wall positioned between the RF component and the digital component.

6. The electronic device of claim 5, further comprising a second dividing wall positioned an attenuation distance from the first dividing wall.

7. The electronic device of claim 5, further comprising an RF gasket attached to the first dividing wall, at least a portion of the RF gasket located between the first dividing wall and the board.

8. The electronic device of claim 1, wherein the board is a circuit board.

9. An electronic device comprising:
    an assembly having:
        a board; and
        an RF component coupled to the board, the RF component operates at an RF frequency and generates electromagnetic energy at least at the RF frequency; and
    an enclosure including:
        a plate coupled to the assembly such that the RF component is located between the plate and the board;
        a wall coupled to the plate such that the wall is located between the plate and the board; and
        an outer wall perpendicular to the plate, the outer wall positioned a distance less than one eighth of a wavelength corresponding to the RF frequency from the wall.

10. A enclosure for housing an assembly, the assembly having an RF component and a second electronic component, the RF component operates at a first frequency and generates electromagnetic energy at least at the RF frequency, the enclosure comprising:
    a plate;
    a first dividing wall coupled to the plate, the first dividing wall positioned between the RF component and the second electronic component such that the first dividing wall is located to separate the RF component and the second electronic component;
    a second dividing wall perpendicular to the plate positioned a distance of less than one eighth of wavelength corresponding to the RF frequency from the first dividing wall.

11. The enclosure of claim 10, further comprising an RF gasket attached to the first dividing wall.

12. The enclosure of claim 10, wherein the first dividing wall is orbitally riveted to the plate.

13. The enclosure of claim 12, wherein:
    the second component operates at a second frequency; and
    the attenuation distance is less than one eighth of a wavelength of the first frequency.

14. The enclosure of claim 10, wherein the second dividing wall is orbitally riveted to the plate.

15. The enclosure of claim 10, further comprising;
    an outer wall perpendicular to the plate;
    an inner wall perpendicular to the plate, the inner wall positioned an attenuation distance from the outer wall, the inner wall orbitally riveted to the plate.

16. The enclosure of claim 15, wherein the outer wall is orbitally riveted to the plate.

17. An electronic device comprising:
    an assembly having:
        a board; and
        a first electronic component coupled to the board, the first electronic component operates at a first frequency and generates electromagnetic energy at least at the first frequency; and
    an enclosure including:
        a plate coupled to the assembly such that the first electronic component is located between the plate and the board;

a wall orbitally riveted to the plate such that the wall is located between the plate and the board, where the wall being orbitally riveted to the plate by at least one protuberance in the wall fitting into at least one recess in the plate; and at least one standoff coupled to the plate; and an RF gasket attached to the wall, at least a portion of the RF gasket located between the wall and board.

18. The enclosure of claim 17, further comprising an outer wall perpendicular to the plate positioned an attenuation distance from the wall, wherein the attenuation distance comprises a distance at which the electromagnetic energy at the frequency attenuates significantly.

19. The enclosure of claim 18, wherein the outer wall is orbitally riveted to the plate.

20. The enclosure of claim 18, wherein the attenuation distance is less than one eighth of a wavelength of the frequency.

21. A enclosure for housing an assembly has a first electronic component and a second electronic component, the first electronic component operates at a first frequency and generates electromagnetic energy at least at the first frequency, the enclosure comprising:

a plate;

a first dividing wall orbitally riveted to the plate, the first dividing wall positioned between the first electronic component and the second electronic component such that the first dividing wall is located to separate the first component and the second component, where the first dividing wall being orbitally riveted to the plate by at least one protuberance in the first dividing wall fitting into at least one recess in the plate; and at least one standoff coupled to the plate; and a gasket attached to the wall, at least a portion of the RF gasket located between the wall and board.

22. The enclosure of claim 21, further comprising a second dividing wall positioned an attenuation distance from the first dividing wall, wherein the attenuation distance comprises a distance at which the electromagnetic energy at the first frequency attenuates significantly.

23. The enclosure of claim 22, wherein the second dividing wall is orbitally riveted to the plate.

24. The enclosure of claim 21, further comprising;

an outer wall perpendicular to the plate;

an inner wall perpendicular to the plate, the inner wall positioned an attenuation distance from the outer wall, the inner wall orbitally riveted to the plate.

25. The enclosure of claim 24, wherein the outer wall is orbitally riveted to the plate.

26. The electronic device of claim 21, wherein:

the first is an RF component; and the second component is a digital component operating at a digital frequency.

* * * * *